United States Patent
Mayeda et al.

[11] Patent Number: 5,497,727
[45] Date of Patent: Mar. 12, 1996

[54] COOLING ELEMENT FOR A SEMICONDUCTOR FABRICATION CHAMBER

[75] Inventors: Mark Mayeda, Cupertino; Rennie Barber, Milpitas, both of Calif.

[73] Assignee: LSI Logic Corporation, Milpitas, Calif.

[21] Appl. No.: 118,362

[22] Filed: Sep. 7, 1993

[51] Int. Cl.⁶ .................................................. C23C 16/00
[52] U.S. Cl. ........................ 118/733; 118/726; 29/25.01
[58] Field of Search ..................................... 118/724, 726, 118/733

[56] References Cited

U.S. PATENT DOCUMENTS

| | | |
|---|---|---|
| 4,539,933 | 9/1985 | Campbell ................................. 118/733 |
| 4,556,471 | 12/1985 | Bergman et al. . |
| 4,567,938 | 2/1986 | Turner . |
| 4,620,081 | 10/1986 | Zeren . |
| 4,641,603 | 2/1987 | Miyazaki et al. ........................ 118/724 |
| 4,760,244 | 7/1988 | Hokynar . |
| 4,923,584 | 5/1990 | Bramhall, Jr. et al. .................. 118/733 |
| 5,062,386 | 11/1991 | Christensen ............................. 118/733 |
| 5,318,633 | 6/1994 | Yamamoto et al. ...................... 118/724 |
| 5,329,095 | 7/1994 | Okase ...................................... 118/724 |

*Primary Examiner*—George Fourson
*Assistant Examiner*—Brian K. Dutton
*Attorney, Agent, or Firm*—Poms, Smith, Lande & Rose

[57] ABSTRACT

A novel semiconductor fabrication chamber includes a quartz vessel and a metal vessel with a resilient sealing member disposed between the quartz and metal vessels to define a vacuum chamber, along with a cooling assembly mounted on a quartz flange extending around the perimeter of the quartz vessel. A liquid or gaseous cooling medium is passed through the cooling assembly to reduce the operating temperature of a portion of the resilient sealing member in contact with the quartz flange during semiconductor fabrication processing so as to extend the useful life of the sealing member. The cooling assembly is secured to the quartz flange using a plurality of clamping fixtures for easy installation and retrofitting.

6 Claims, 1 Drawing Sheet

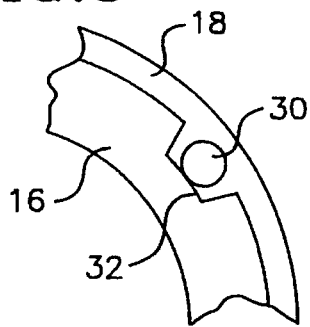
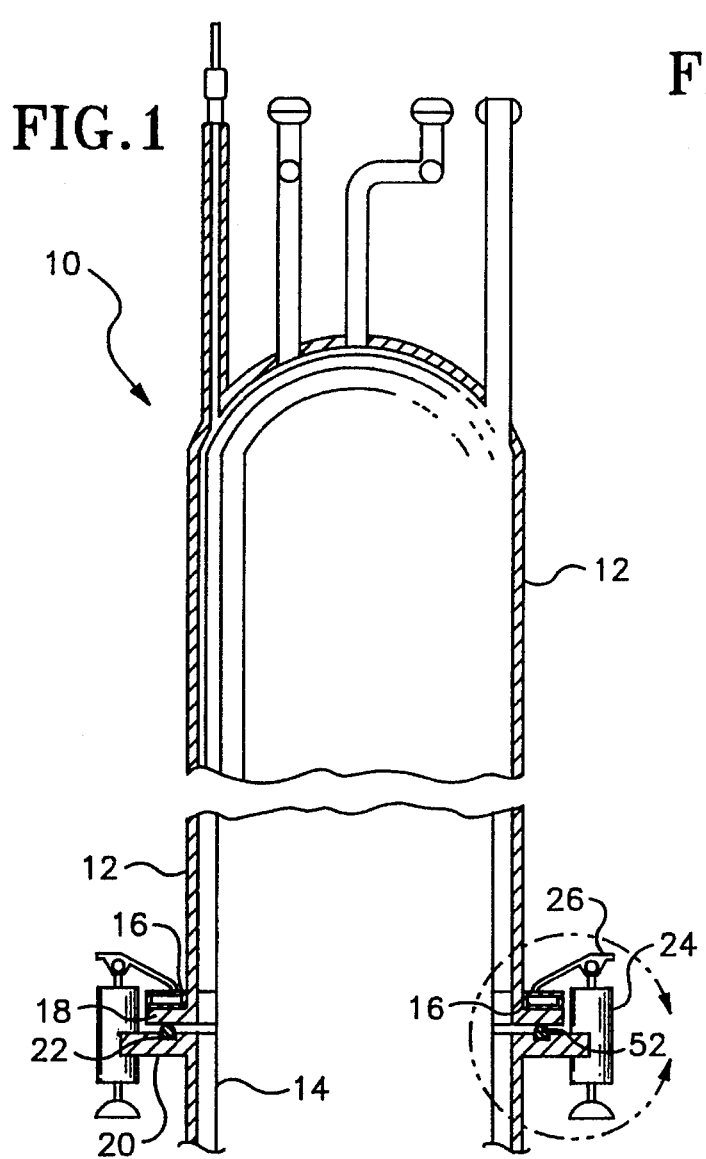
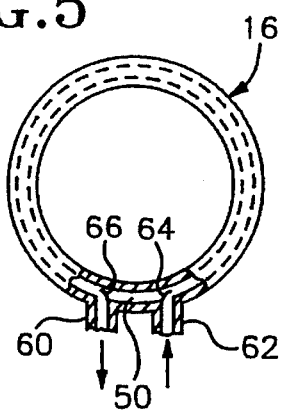
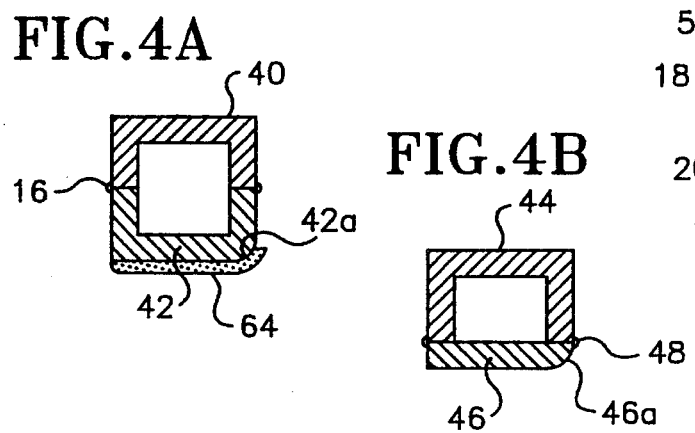

COOLING ELEMENT FOR A SEMICONDUCTOR FABRICATION CHAMBER

FIELD OF THE INVENTION

This invention relates to the chemical processing of semiconductor wafers in sealed fabrication vessels, and more particularly, to an apparatus and method for extending the operational life of a resilient sealing member forming part of the vessel.

BACKGROUND OF THE INVENTION

A number of integrated circuit fabrication processes have been developed that involve depositing thin films on a semiconductor substrate and chemically reacting these films with the substrate at high temperatures and in a controlled atmosphere. Such processes are normally carried out in an apparatus termed a fabrication vessel. A typical fabrication chamber includes a quartz vessel, also termed a quartz tube, coupled to a metallic vessel with a resilient sealing member disposed between the quartz and metal vessels. The sealing member is intended either to form a vacuum seal or, alternatively, to seal the controlled and sometimes high temperature atmosphere within the fabrication chamber and away from the ambient atmosphere. Normally a groove is formed in a flange portion of the metallic vessel for receiving the resilient sealing member. During semiconductor processing, the fabrication chamber may or may not be evacuated to subatmospheric pressures and is typically elevated to high temperatures during which the semiconductor wafer is brought into contact with an atmosphere containing various gases. Unfortunately, the high temperatures maintained in the chamber prior to and during the fabrication process normally causes the temperature of the fabrication chamber itself to substantially increase during semiconductor wafer processing. The resulting high temperature of the fabrication chamber often induces accelerated degradation and premature failure of the resilient sealing member.

A major objective in commercial semiconductor manufacturing is to achieve higher throughput in terms of the number of wafers that are processed over time. One way to significantly increase throughput efficiency is to maximize the number of process runs through a semiconductor fabrication chamber by minimizing chamber down-time associated with the repair and/or replacement of heat damaged sealing members. Thus, some conventional fabrication chambers may include cooling channels or manifold systems integrally included within the body of the metallic vessel portion of the fabrication chamber to lower the operational temperature of the metallic vessel and to increase the useful life of the resilient sealing member.

U.S. Pat. No. 4,556,471, for example, discloses a physical vapor deposition chamber which incorporates a complex manifold system for supplying cooling water to a cathode assembly. Perforations are further provided in the main cooling reservoir surrounding the cathode assembly, however, for also channeling some cooling medium directly into contact with an O-ring seal which provides fluid-tight sealing of the cathode assembly reservoir. This cooling apparatus requires extensive and expensive precision machining of a complex cooling manifold system that is integrally included within the body of the metallic deposition chamber. Moreover, corrosive agents contained within the cooling medium accelerate O-ring seal degradation resulting from direct contact of the O-ring with the cooling medium.

A cooling arrangement for semiconductor fabrication chambers including quartz-type vessels is also disclosed in U.S. Pat. No. 4,641,603 (hereinafter "the '603 chamber"). The fabrication chamber disclosed in this patent includes a dedicated cooling member disposed between a metal base plate and a mounting surface of a quartz vessel. The '603 chamber is apparently intended for sub-atmosphere chemical processing of semiconductor components. To provide a sufficient vacuum seal between the base plate and the quartz vessel, the dedicated channel member of the '603 chamber also includes an O-ring groove for sealing with the quartz vessel. One significant disadvantage of the '603 chamber is, however, the use of at least two O-ring seal members, rather than a single sealing member, to guarantee sufficient vacuum sealing of the fabrication chamber. A first O-ring seal is used to form a vacuum seal between the quartz vessel and the top surface of a cooling member. A second O-ring is provided to form a seal between a metal base plate of the '603 chamber and the bottom surface of the cooling member. Premature degradation or failure of either the first or second O-ring seals, however, will compromise the efficacy of the entire vacuum chamber, and thus decrease the overall semiconductor processing throughput through the '603 chamber.

Thus, there is still a need in the semiconductor manufacturing industry for a cooling apparatus that can effectively reduce the operational temperature of resilient sealing members employed in semiconductor fabrication chambers. There is a further need for a cooling apparatus that is suitable for retrofitting to conventional semiconductor fabrication chambers that lack appropriate cooling apparatus. The present invention fulfills this need.

SUMMARY OF THE INVENTION

In accordance with one aspect of the present invention, a sealing member is disposed between the quartz and metal vessels of a high temperature semiconductor fabrication chamber and cooled by a cooling assembly mounted on an exterior surface of a flange portion of the quartz vessel. A cooling medium is passed into and out of a hollow passage within the cooling assembly to lower the effective temperature of the flange portion of the quartz vessel in direct contact with the sealing member. By cooling the flange portion of the quartz vessel, rather than the metal vessel or some portion thereof, enhanced preservation of the sealing member is achieved and the useful operational life of the semiconductor fabrication chamber between maintenance cyclings is greatly extended. In direct contrast to conventional cooling schemes directed to lowering the temperature of a metal structure supporting the sealing member, the present invention provides cooling to a portion of the quartz vessel in direct contact with the sealing member. This critical portion of the sealing member has been identified by the inventors as an area concentrating the highest thermal energy on the resilient sealing member.

In accordance with another aspect of the invention, the cooling assembly disclosed herein counters a deleterious phenomena that occurs in quartz-type semiconductor fabrication chambers that the inventors have found to be a significant problem previously unaddressed in prior art cooling designs. Prior art cooling schemes have failed to address the phenomena of infrared radiation generated within the very high temperature environment of the fabrication vessel and directed to the sealing member independent of thermal conduction phenomena. The quartz vessel has been found to act as an electromagnetic waveguide for infrared radiation and to transmit this deleterious radiation through the quartz vessel to converge at the flange portion of the quartz vessel where the infrared radiation is coupled to the resilient sealing member in contact with the quartz flange. In addition to heat conducted through the quartz vessel, the additional infrared radiation transmitted through the quartz vessel elevates the temperature of the quartz flange/sealing member interface to an unacceptably high level, resulting in damage to, and accelerated aging of, that portion of the resilient sealing member most critical in the formation of either a vacuum seal or atmospheric seal with the quartz vessel. It has been demonstrated that the present invention sufficiently regulates the quartz flange/sealing member interface temperature to a degree sufficient to ameliorate the dual deleterious effects of thermal energy conductance and infrared radiation coupling to the resilient sealing member, and substantially extends the life of this critical component of a semiconductor fabrication chamber. Other objects, features, and advantages of the invention will become apparent from a consideration of the following detailed description and from the accompanying drawings.

BRIEF DESCRIPTION OF THE DRAWINGS

FIG. 1 is a side view of a semiconductor fabrication chamber including an upper quartz vessel and a lower metal vessel;

FIG. 2 is an exaggerated showing of a sealing member disposed between the quartz vessel and metal vessel mounting flanges with a cooling apparatus of the present invention mounted on the quartz mounting flange;

FIG. 3 is a depiction of a cooling apparatus on the quartz mounting flange with a recessed portion provided to accommodate an alignment feature on the quartz flange;

FIG. 4A is a cross sectional view of a cooling ring comprising welded upper and lower C-shaped channels;

FIG. 4B is a cross sectional view of a cooling ring comprising a welded upper C-shaped channel and lower base member; and FIG. 5 is a top plan view of a cooling apparatus of the present invention with a cut-away showing of an inlet and outlet port, and a hollow interior.

DETAILED DESCRIPTION OF THE PREFERRED EMBODIMENT

Referring to the drawings, and more particularly to FIG. 1, a vertically oriented semiconductor fabrication chamber 10 is shown, including an upper quartz vessel 12 and a lower metal vessel 14. The quartz vessel 12 may have a cylindrical cross-sectional configuration, and preferably includes a quartz flange 18 extending circumferentially around an end of the quartz vessel 12 that is brought in contact with the metal vessel 14. The quartz flange 18 may include additional quartz material to accommodate thermal and mechanical stresses localized at the mounting interface between the quartz flange 18 and the lower metal vessel 14. The metal vessel 14 also includes a metal flange 20 which extends circumferentially around the mounting end of the metal vessel 14 that is brought in contact with the quartz vessel 12. The metal vessel 14 further includes a second end (not shown) configured for engagement with a pedestal (also not shown) on which a semi-conductor boat rests.

In a preferred embodiment, the outer diameter of the metal flange 20 is greater than the outer diameter of the quartz flange 18. The metal flange portion 20 extending beyond the quartz flange 18 is provided to accommodate a plurality of securing clamps 24. The metal flange 20 further defines a groove 52 for receipt of a sealing member 22. When the metal flange 20 and quartz flange 18 are pressed together, the sealing member 22 provides a seal between the metal vessel 14 and the quartz vessel 12. The sealing member 22 may be removed from the groove 52 provided in the metal flange 20 and is typically replaced when it has reached the end of its useful life, and no longer provides a satisfactory seal between the quartz vessel 12 and the metal vessel 14. Depending on the type or application of the fabrication chamber 10, the sealing member 22 may or may not form a vacuum seal between the quartz vessel 12 and the metal vessel 14. In applications where the fabrication vessel 10 is operated at subatmospheric or near vacuum conditions, the sealing member 22 will form a vacuum tight type seal between the quartz vessel 12 and the metal vessel 14. This type of seal is not required, however, if fabrication processing takes place within the chamber 10 at near atmospheric pressures. In the later instance, it is sufficient to merely provide a seal that prevents gasses within the chamber from escaping. The sealing member 22 may be made in any desired configuration suitable for its intended sealing function. In one embodiment where the fabrication chamber operates at sub-atmospheric or near vacuum conditions, the sealing member 22 is a conventional O-ring. In an alternate embodiment where semiconductor fabrication processing takes place at atmospheric or near atmospheric pressures, a hollow O-ring seal may be employed to prevent the atmosphere interior to the chamber from mixing with the atmosphere exterior to the chamber.

As shown in FIG. 1, the cooling assembly 16 is mounted on the quartz flange 18. Securing clamps 24, shown clamped to the metal flange 20 by known means, include a securing latch 26 which exerts a biasing force against the cooling assembly 16 and the quartz flange 18 when the quartz vessel 12 is mounted to the metal vessel 14. The securing latch 26 preferably comprises a spring actuated pivotal lever which exerts a biasing force on the cooling assembly 16 which is proportional to the strength of the included spring. It is noted that only a moderate level of clamping force is required in the disclosed mounting configuration since evacuation of the fabrication chamber 10 ensures a gradual mating between the quartz vessel 12 and the metal vessel 14 during semiconductor fabrication that may, if desired, be vacuum tight. Excessive clamping force can result in permanent deformation of the sealing member 22, however, as well as pinching or tearing of the sealing member 22.

A detailed view of the cooling assembly 16 and the fabrication chamber sealing interface is provided in FIG. 2. The sealing interface shown in FIG. 2 is an exaggerated pre-mounting depiction, and is provided for clarity of the description presented herein. The sealing member 22, shown in a relaxed configuration, is removably installed in a sealing member groove 52 of the metal flange 20. The quartz flange 18 may be properly aligned with the metal flange 20 during the mounting of the quartz vessel 12 on the metal vessel 14 by use of at least one alignment pin 30, preferably included on the metal flange 20. Preferably, the cooling assembly 16 has a generally rectangular cross section configuration to maximize the surface area of the cooling assembly 16 brought in direct contact with the quartz flange 18. As discussed more fully below, a portion of the lower inside edge of the cooling ring 16 may be chamfered or otherwise rounded or curved to accommodate a curvature of the quartz flange 16 immediately adjacent the vertical walls of the quartz vessel 12.

During semiconductor fabrication, internal temperatures on the order of 800° C. are maintained in the fabrication chamber 10 for extended periods of time. The intense thermal environment associated with semiconductor fabrication processing has been found to induce premature aging and accelerated deterioration of the sealing member 22. Specifically, heat is conducted through the metal vessel 14 and the metal flange 20 to the sealing member 22 in sealing member groove 52. Heat is also conducted through the quartz vessel 12 and the quartz flange 18 to the sealing member 22. It has also been discovered by the inventors that infrared radiation generated within the high temperature environment is further transmitted along the quartz vessel 12, which acts like a waveguide, and is coupled to a portion of the sealing member 22 in direct contact with the quartz flange 18.

It has been found that failure of the sealing member 22 typically results from excessively high levels of heat exposure in that portion of the sealing member 22 in direct surface contact with the quartz flange 18. The temperature of this portion of the sealing member 22, in direct contact with the quartz flange 18, is further disadvantageously elevated by the infrared radiation coupled out of the quartz flange 18 into this portion of the sealing member 22. Conventional cooling systems, similar to those described in the Background of the Invention above, have been found to inadequately regulate the temperature of this critical interface, and instead only regulate the temperature of the metal surfaces supporting the resilient sealing member 22 and portions of the sealing member 22 in direct contact therewith. It has been determined that reducing the temperature of the quartz flange 18 in proximity of the sealing member 22, rather than the metal surfaces in contact with the sealing member 22, such as metal walls of the grove 52, significantly reduces the temperature of this critical portion of the sealing member 22 both during and after semiconductor fabrication. It has, for example, been observed that most of the thermal damage to the sealing member 22 often occurs after the semiconductor fabrication process is completed and the semiconductor wafer boat is being removed from the fabrication chamber 10. Shortly after the fabrication processing is completed, the boat and the wafers are still at an elevated temperature, on the order of 800° degrees centigrade. The wafer boat, however, is typically removed by being lowered past the quartz flange 18 and metal flange 20 interface. The inventors have noted that the greatest amount of thermal damage to the sealing member 22 occurs as the exceedingly hot wafer boat, emitting strongly in the infrared spectrum, passes the quartz flange 18 and metal flange 20 interface. This thermal damage is usually substantially avoided if the cooling ring 16 of the present invention is employed.

Thermal regulation of the quartz flange 18 and absorption of infrared radiation propagating through the quartz flange 18, thus greatly extends the useful life of the sealing member 22 and significantly reduces semiconductor fabrication chamber down-time normally required for maintenance and replacement of the sealing member 22. Moreover, it has also been found that an undesirable excessive build-up of particulate deposition on interior surfaces of the metal vessel normally results from excessively cooling the metal structure supporting the sealing member 22 in an effort to reduce the temperature of the sealing member 22. Since the present invention provides cooling of the quartz flange 18 in contact with the sealing member 22, rather than the metal flange 20 supporting the sealing member 22, the build-up of particulate deposition on the metal vessel 14 is substantially reduced. This reduction in the build-up of particulates further greatly extends the number of processing operations that may be performed in the chamber before particulate cleaning and down-time is required.

As further shown in FIG. 2 and discussed briefly above, the cooling assembly 16 is mounted on the quartz flange 18 and extends generally circumferentially around the quartz vessel 12. In alternative configurations, however, the cooling assembly 16 may form a partial ring structure which encompasses most, but not all, of the quartz flange 18. In FIG. 5 for example, the cooling assembly 16 illustrated is configured for installation on the quartz flange 18 of a substantially cylindrical quartz vessel 12. It should be noted that the cooling assembly 16 may have a configuration other than the circular shape depicted in FIG. 5 without departing from the scope and spirit of the present invention. The shape of the cooling assembly 16 may be further adapted to conform to other configurations of quartz vessels 12 and quartz flanges 18 having other non-circular configurations.

As shown in FIG. 5, a passage 50, defining the interior of the cooling assembly 16, is provided to allow a cooling medium to pass into and out of the cooling assembly 16. In one embodiment of the present invention, a liquid medium, such as for example water, is introduced into the cooling assembly 16 through at least one inlet port 62. The cooling medium further passes out of the cooling assembly 16 through at least one outlet port 60. In an alternative embodiment, a gaseous cooling medium may be introduced into and expelled from cooling system 16 in a manner similar to that previously described. It may also be desirable to include an inlet flow guide 64, extending into the hollow passage 50, to direct the flow of the cooling medium introduced into the cooling assembly 16 through inlet port 62, and to prevent stagnation of the cooling medium flow within the cooling assembly 16. Similarly, an outlet flow guide 66 may, but need not necessarily, be included at or near the outlet port 60 to effectively direct the cooling medium flow out of the passage 50 of the cooling assembly 16. In one embodiment a portion of the outlet guide 66 extends across the entire surface of the channel 50 to prevent re-circulation of heated cooling fluid within the cooling assembly 16.

To ensure proper mounting of the quartz vessel 12 on the metal vessel 14, at least one alignment pin 30 may be included on the quartz flange 18 to prohibit misalignment of the two vessels 12 and 14. Misalignment can result in damage to the sealing member 22, and can compromise the integrity of the vacuum environment of the semiconductor fabrication chamber 10 during operation. FIG. 3 is a partial view of one embodiment of the present invention in which a portion of the cooling assembly 16 defines a recess 32 configured to accommodate an alignment pin 30 that may be included on the quartz flange 18. Incorporation of the recess 32 into the cooling assembly 16 permits easy and inexpensive retrofitting of the present invention to conventional fabrication chambers. Semiconductor fabrication chambers that provide cooling of the metal structure supporting the resilient sealing member may thus also be advantageously retrofitted with the cooling system disclosed herein on the quartz vessel to further reduce heat and infrared radiation related degradation of the vacuum sealing member.

As shown in FIGS. 4A and 4B, one preferred embodiment of the cooling assembly 16 is preferably constructed using two metal members welded together to form a hollow structure. In FIG. 4A, an upper C-channel member 40 and a lower C-channel member 42, being generally equivalent in dimension, are welded together at mating surfaces 48. As further illustrated in FIG. 4A, a lower inner region 42a of the lower channel member 42 may be rounded or chamfered to more closely conform to the curvature of the interface between the quartz flange 18 and the vertical walls at the quartz vessel 12. Typically this interface does not form a perfectly perpendicular or right angle juncture, but instead has a curved intersection. The cooling ring edge 42a in contact with this intersection preferable conforms to this curvature. In an alternative configuration, as shown in FIG. 4B, an upper C-channel member 44 may be welded to a flat base member 46 to form the cooling assembly 16. The flat base member 46 preferably also has a chamfered or curved lower inner portion 46a configured to conform to the rounded intersection between the quartz flange 18 and vertical walls of the quartz vessel 12.

The generally rectangular cross-sectional configuration of the cooling assembly 16 maximizes the cooling surface area contacting the quartz flange 18 and the quartz vessel 12. Semiconductor fabrication chambers having a configuration different from that depicted in FIG. 1 may also require a cooling assembly 16 having an alternative shape and cross-sectional configuration to conform to the particular configuration of the quartz vessel 12 and flange 18, and to maximize heat transfer efficiency between the quartz flange 18 and the cooling assembly 16. Stainless steel, titanium, or other refractory alloys are preferred metals for constructing the cooling assembly 16. Use of such metals prevents detrimental leaching of metal from the cooling assembly 16 into the quartz vessel 12 and quartz flange 18 which, over time, can cause problems relating to contamination in the semiconductor wafers being processed within the quartz structure.

In another embodiment of the present invention, a metallic braid or fillet 64, as shown in FIG. 4A, may be disposed between the quartz flange 18 and the lower surface of the cooling assembly 16 to accommodate unevenness in a surface of the quartz flange 18 and to improve the thermal contact between the quartz flange 18 and the cooling assembly 16. An additional layer of thermally conductive and/or infrared absorptive paste or other resilient material may also be applied to the contacting surfaces of the cooling assembly 16 and the quartz flange 18. A lower surface of the cooling assembly 16 in contact with the quartz flange 18 may also be sandblasted or black anodized to enhance absorption of infrared radiation transmitted through the quartz vessel 12 to the quartz flange 18 as well as increase thermal conductivity between the flange 18 and the cooling assembly 16.

In conclusion, it is to be understood that the foregoing detailed description and the accompanying drawings relate to an illustrative implementation of the present invention. The present invention, however, is not limited to this illustrative implementation. Thus, by way of example and not of limitation, the cooling assembly 16 may include recesses of a different configuration than that described herein, or may be configured without recesses, to accommodate the specific shape of the quartz vessel and any alignment mechanism employed to orient the quartz vessel with the metal vessel. Further, the cooling assembly may be formed from more than two metal members as discussed above in one preferred embodiment, or may be a single structure formed through an extrusion process or other known manufacturing processes. Metals other than stainless steel or titanium may alternatively be employed to construct the cooling assembly. Additionally, a plurality of inlet ports 62 and outlet ports 60 may be provided in the cooling assembly to maximize the heat transfer at varying flow rates in the cooling medium, or to accommodate cooling media of varying heat capacities. Accordingly, the present invention is not limited to the system as described in detail herein and as shown in the accompanying drawings.

What is claimed is:

1. A method for maintaining a seal interface between a flanged glass vessel and a metal vessel, of a semiconductor fabrication chamber the method comprising the steps of:

providing a cooling element having at least one cooling surface; and providing a thermal contact between said cooling surface and said glass vessel;

wherein the thermal contact is a coating of a thermally conductive material.

2. The method as recited in claim 1 wherein said thermally conductive material absorbs infrared radiation.

3. The method as recited in claim 1 wherein said cooling element extends substantially around said glass vessel.

4. A method of making a semiconductor device, comprising the steps of:

providing a semiconductor fabrication chamber including a quartz vessel having an exterior annular quartz flange at one end of said quartz vessel, said quartz flange having an upper surface and a lower surface, and a metal vessel having a corresponding annular flange which is formed with a groove configured to receive a resilient sealing member;

attaching said quartz vessel to said metal vessel such that said resilient sealing member is sealingly disposed between said lower surface of said quartz flange and said metal flange;

applying a thermally conductive and infrared absorptive material on said upper surface of said quartz flange;

attaching an annular cooling assembly having a substantially rectangular cross-section with a hollow interior passage to said quartz flange such that said thermally conductive and infrared absorptive material is sandwiched in thermal conductive engagement between said cooling assembly and said upper surface of said quartz flange;

placing a semiconductor wafer in said chamber;

processing said semiconductor wafer inside said chamber at a temperature which causes infrared radiation to be transmitted to said quartz flange by waveguide action of said quartz vessel;

passing a cooling medium through said cooling assembly passage for cooling said quartz flange and said resilient sealing member, whereby said infrared radiation is absorbed and conducted from said quartz flange to said cooling assembly by said thermally conductive and infrared absorptive material;

removing said semiconductor wafer from said chamber; and further processing said semiconductor wafer to form at least one semiconductor device thereon.

5. A method of preserving a resilient sealing member of a semiconductor fabrication chamber, comprising the steps of:

providing a quartz vessel having an exterior annular quartz flange at one end of said quartz vessel, said quartz flange having an upper surface and a lower surface, and a metal vessel having a corresponding annular metal flange which is formed with a groove configured to receive said resilient sealing member;

attaching said quartz vessel to said metal vessel such that said resilient sealing member is sealingly disposed between said lower surface of said quartz flange and said metal flange;

applying a thermally conductive and infrared absorptive material on said Upper surface of said quartz flange;

attaching an annular cooling assembly having a substantially rectangular cross-section with a hollow interior passage to said quartz flange such that said thermally conductive and infrared absorptive material is sandwiched in thermal conductive engagement between said cooling assembly and said upper surface of said quartz flange; and passing a cooling medium through said cooling assembly passage for cooling said quartz flange and said resilient sealing member, whereby infrared radiation transmitted to said quartz flange by waveguide action of said quartz vessel is absorbed and conducted to said cooling assembly by said thermally conductive and infrared absorptive material.

6. The method of claim 5 further comprising the step of securing said cooling assembly to said quartz flange with a plurality of securing clamps.

* * * * *